United States Patent [19]

Shih et al.

[11] Patent Number: 5,283,452
[45] Date of Patent: Feb. 1, 1994

[54] DISTRIBUTED CELL MONOLITHIC MIRCOWAVE INTEGRATED CIRCUIT (MMIC) FIELD-EFFECT TRANSISTOR (FET) AMPLIFIER

[75] Inventors: Yi-Chi Shih, Torrance; David C. Wang, Rancho Palos Verdes; Huy M. Le, Monterey Park; Vincent Hwang, Long Beach; Tom Y. Chi, San Gabriel, all of Calif.

[73] Assignee: Hughes Aircraft Company, Los Angeles, Calif.

[21] Appl. No.: 837,448

[22] Filed: Feb. 14, 1992

[51] Int. Cl.$^5$ .......................................... H01L 29/812
[52] U.S. Cl. .................................... 257/277; 257/276; 257/280
[58] Field of Search ................... 357/22 I, 22 J, 22 K, 357/22 H; 257/275, 276, 277, 280

[56] References Cited

U.S. PATENT DOCUMENTS 4,359,754 11/1982 Hayakawa et al. ................. 357/22
5,160,984 11/1992 Mochizuki et al. ................. 257/277

OTHER PUBLICATIONS

"GaAs MESFET Circuit Design", by R. Soares, Artech House, 1988 pp. 134.
"MMIC Technology: Better Performance at Affordable Cost", in Microwave Journal, Apr. 1988, pp. 135-143.

Primary Examiner—Gene M. Munson
Attorney, Agent, or Firm—Georgann S. Grunebach; Terje Gudmestad; W. K. Denson-Low

[57] ABSTRACT

A distributed cell field-effect transistor (FET) amplifier (40) includes a plurality of parallel, elongated source (46a) and drain (46b) regions of individual FET unit cells (46) formed in a substrate (42) in transverse alternating relation, with a plurality of elongated channel regions (46c) being formed between and parallel to adjacent source (46a) and drain (46b) regions respectively. A source foot (48) and a drain foot (50) extend perpendicular to the source (46a) and drain (46b) regions on opposite longitudinally spaced sides thereof respectively. A gate foot (52) extends parallel to the source (48) and drain (50) feet, between the source foot (48) and the cells (46). Source (54) and drain (56) pads and gate (58) fingers extend from the source (48), drain (50) and gate (52) feet into electrical connection with the respective source (46a), drain (46b) and gate (46c) regions respectively. The source pads (54) include air-bridge portions (54b) which extend over the gate foot (52) without making contact therewith. A fixed tuning circuit (70) is connected between the gate foot (52) and source foot (48), including an inductive stub (72) having a first end connected to the gate foot (52) and a second end, and a capacitor (74) having a first plate (74a) which is integral with the source foot (48) and a second plate connected to the second end of the stub (72). The integration of the capacitor (74) with the source foot (48) enables the amplifier (40) to be tuned at the gate foot (52), thereby eliminating undesirable coupling effects and the need for a separate via for the tuning circuit (70).

13 Claims, 3 Drawing Sheets

DISTRIBUTED CELL MONOLITHIC MIRCOWAVE INTEGRATED CIRCUIT (MMIC) FIELD-EFFECT TRANSISTOR (FET) AMPLIFIER

BACKGROUND OF THE INVENTION

1. Field of the Invention

The present invention generally relates to the field of high frequency electronic signal amplifiers, and more specifically to a monolithic microwave integrated circuit (MMIC) field-effect transistor (FET) amplifier.

2. Description of the Related Art

Monolithic microwave integrated circuits on gallium arsenide (GaAs) and other semi-insulating substrates enable active array radar, communications and other systems to be produced which are compact, lightweight, provide high performance and can be manufactured inexpensively on a commercial production basis. A general treatise on MMICs is presented in an article entitled "MMIC Technology: Better Performance at Affordable Cost", in Microwave Journal, April 1988, pp. 135-143.

Distributed circuit arrangements are employed in MMIC amplifiers to increase the power handling capability. This is accomplished by fabricating a plurality of amplifier unit cells on a substrate and interconnecting them in a parallel interdigitated configuration.

An example of such a prior art MMIC amplifier is illustrated in FIG. 1 and generally designated as 10. The amplifier 10 includes a plurality of transversely spaced metal-semiconductor field effect transistor (MESFET) unit cells fabricated in a GaAs substrate, each including doped source, drain and channel regions which are not visible in the drawing. The amplifier 10 further includes a plurality of parallel, elongated drain pads 14 which overlie the drain regions of the MESFET cells in electrical connection therewith. The right ends of the drain pads 14 are interconnected by a drain foot 16 which enables the drain pads 14 to be collectively connected to external circuitry.

A plurality of source pads 18 are interspersed between the respective drain pads 14 in electrical connection with the source regions of the MESFET cells. A plurality of gate fingers 20 are interspersed between the respective drain pads 14 and source pads 18 in electrical connection with the respective channel regions of the MESFET cells, and interconnected at their left ends to a gate foot 22.

Source connection pads 24 and 26 are provided at the upper and lower ends of the amplifier 10, and connected to a ground plane (not shown) on the opposite side of the substrate 12 by electrically conductive vertical interconnects or vias 28 and 30 respectively. The source pads 18 are connected to the source connection pads 24 and 26 by an electrically conductive airbridge 34 having first portions 34a which are ohmically bonded to the source pads 18 and second portions 34b which extend over and are electrically isolated from the drain pads 14 and gate fingers 20.

The amplifier 10 has a common emitter configuration, with the source pads 18 grounded through the vias 28 and 30 and ground plane. An input signal is applied to the gate regions of all of the MESFET cells in parallel through the gate foot 22 and gate fingers 20, and an output signal is taken from the drains of all of the MESFET cells in parallel through the drain pads 14 and drain foot 16.

In this configuration, the total collector current flow through the amplifier 10 is distributed between the MESFET cells. However, due to the architecture of the amplifier 10, the electrical characteristics of the unit MESFET cells are different and the collector currents through the individual cells are also different.

More specifically, the source pads 18 are effectively connected to the source connection pads 24 and 26 in series through the airbridge 34. The source inductance, and thereby the inductive reactance and collector current varies between the unit cells, with the source inductance of the inner cells being higher than the outer cells. For am amplifier with a large number of cells, the source inductance of the inner cells can become excessive, thereby reducing the cutoff frequency of the amplifier.

The series connection of the source pads 18 to the source connection pads 24 and 26 also creates a phase difference between the signals propagating through the individual MESFET cells, thereby reducing the signal combining efficiency of the amplifier 10. The connection of the portions 34a of the airbridge 34 to the source pads 18 requires a relatively large amount of space, thereby increasing the spacing between the gate fingers 20 and further increasing the signal phase variation.

Further drawbacks of the arrangement of the amplifier 10 are that it occupies an inefficiently large amount of space on the substrate 12, and is limited to only high power applications.

SUMMARY OF THE INVENTION

A MMIC FET amplifier embodying the present invention includes a plurality of parallel, elongated source and drain regions of individual FET unit cells formed in a substrate in transverse alternating relation, with a plurality of elongated channels being formed between and parallel to adjacent source and drain regions respectively. The FETs are preferably MESFETs, but may be other types of FETs.

A source foot and a drain foot extend perpendicular to the source, drain and channel regions on opposite longitudinally spaced sides thereof respectively. A gate foot extends parallel to the source and drain feet, between the source foot and the cells. Source and drain pads and gate fingers extend from the source, drain and gate feet into electrical connection with the respective source, drain and gate regions respectively. The gate fingers are preferably spaced closer to the source pads than to the drain pads to reduce the source resistance. The source pads include airbridge portions which extend over the gate foot without making contact therewith.

A fixed or preset tuning circuit is connected between the gate foot and source foot, including an inductive stub having a first end connected to the gate foot and a second end, and a capacitor having a first plate which is integral with the source foot and a second plate connected to the second end of the stub.

The present MMIC amplifier provides advantages over the prior art arrangement of FIG. 1 including the following.

1. Reduced source inductance due to connection of the source pads to ground in parallel rather than in series.

2. Smaller size and more compact layout due to reduced width of the source pads and relocation of the source feet from the ends to the gate foot side of the amplifier.

3. Reduced phase variation at the gate fingers, due to the parallel connection of the source pads and reduced spacing between the gate fingers, resulting in increased signal combining efficiency.

4. Accurate preset tuning provided by the tuning circuit, enabling the amplifier to be used as a module in larger scale circuits.

5. Integration of the tuning capacitor with the source foot. This improvement enables the amplifier to be tuned at the gate foot and thereby accurately modeled for design purposes. It further eliminates undesirable coupling effects and the need for a separate via for the tuning circuit, and reduces the circuit area of the amplifier.

These and other features and advantages of the present invention will be apparent to those skilled in the art from the following detailed description, taken together with the refer to like parts.

DETAILED DESCRIPTION OF THE INVENTION

Figure 1:
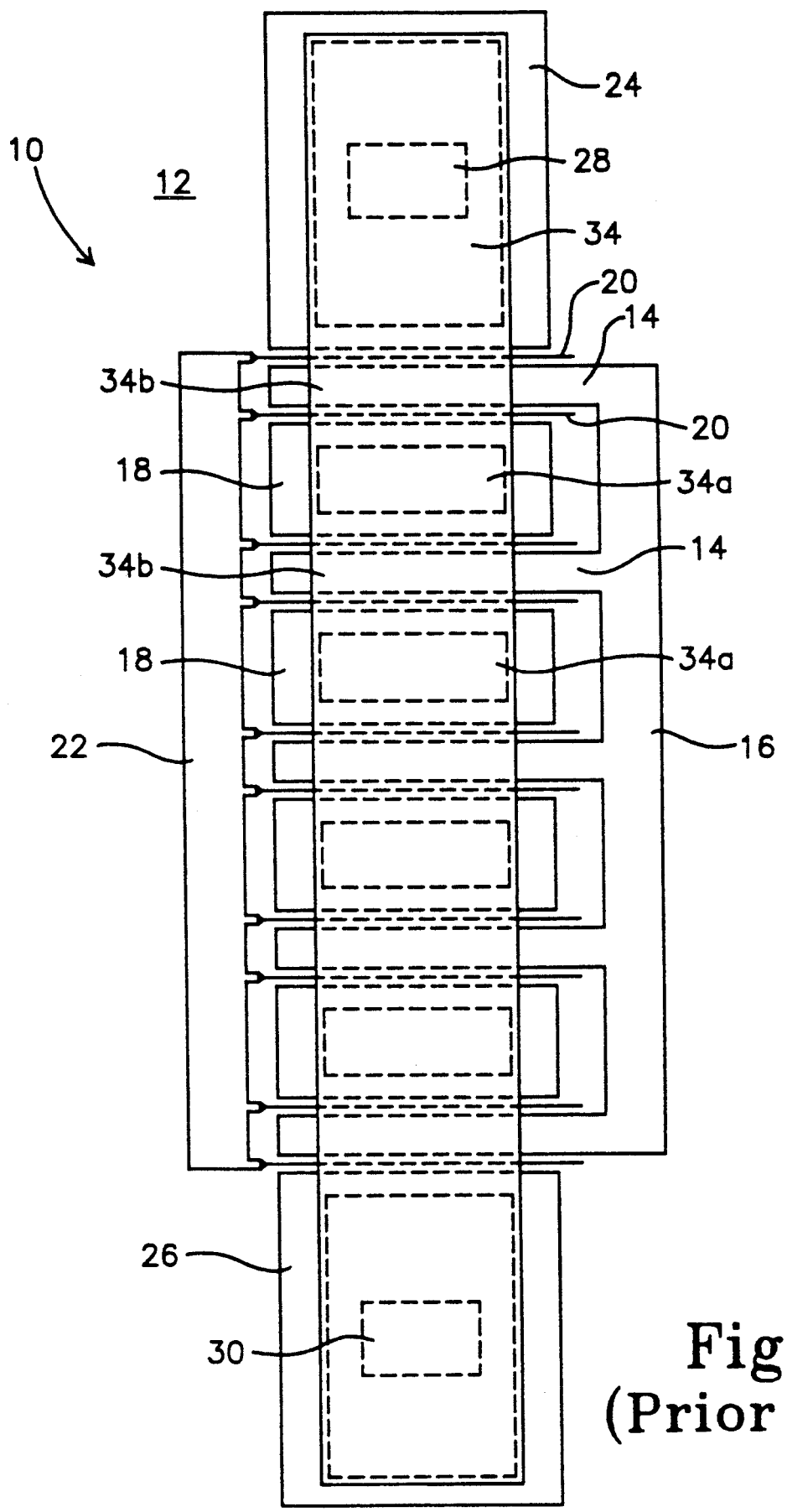
FIG. 1 is a simplified plan view of a prior art distributed cell MMIC amplifier.
Figure 2:
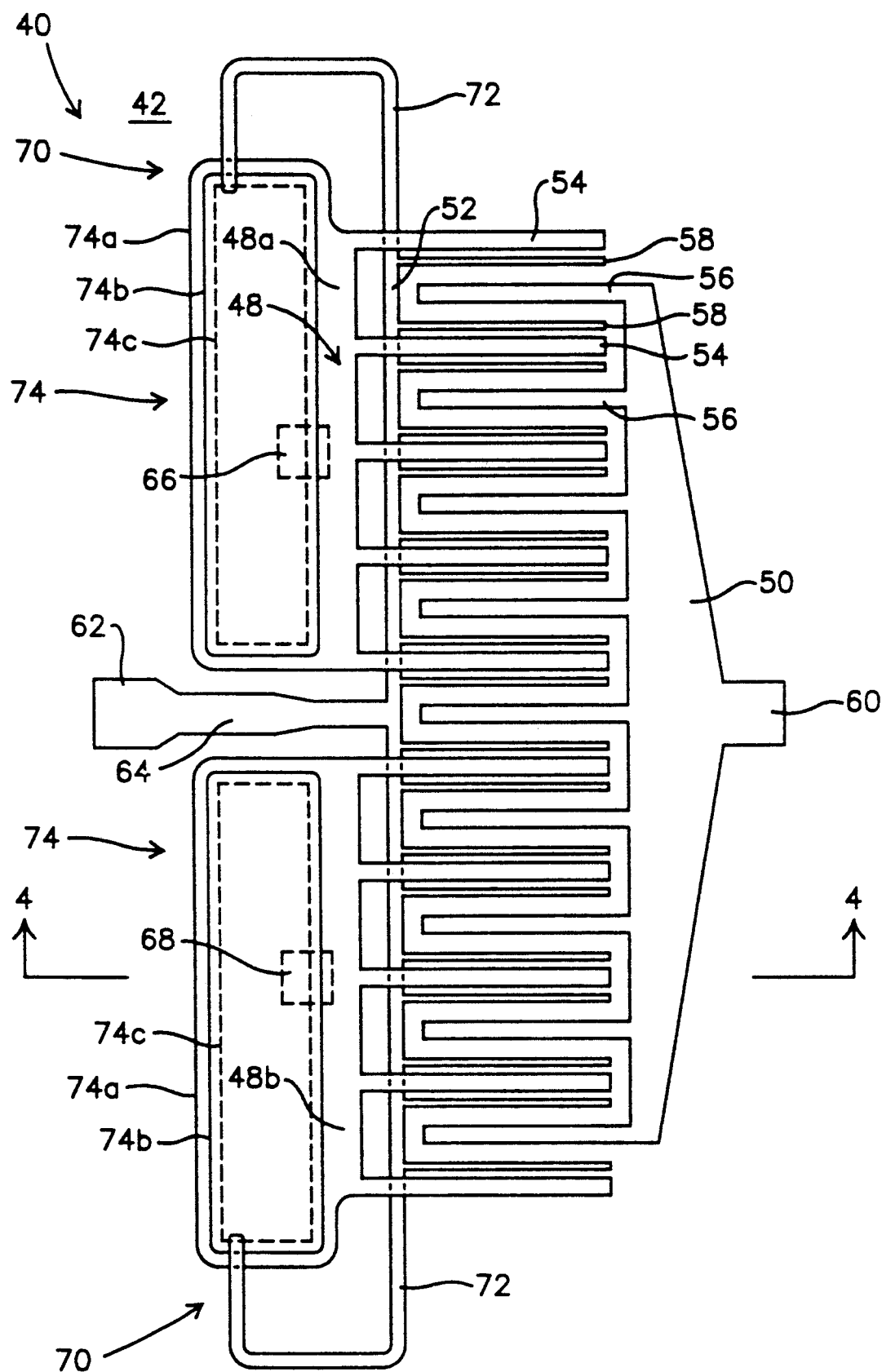
FIG. 2 is a simplified plan view of a distributed cell MMIC amplifier embodying the present invention.
Figure 3:
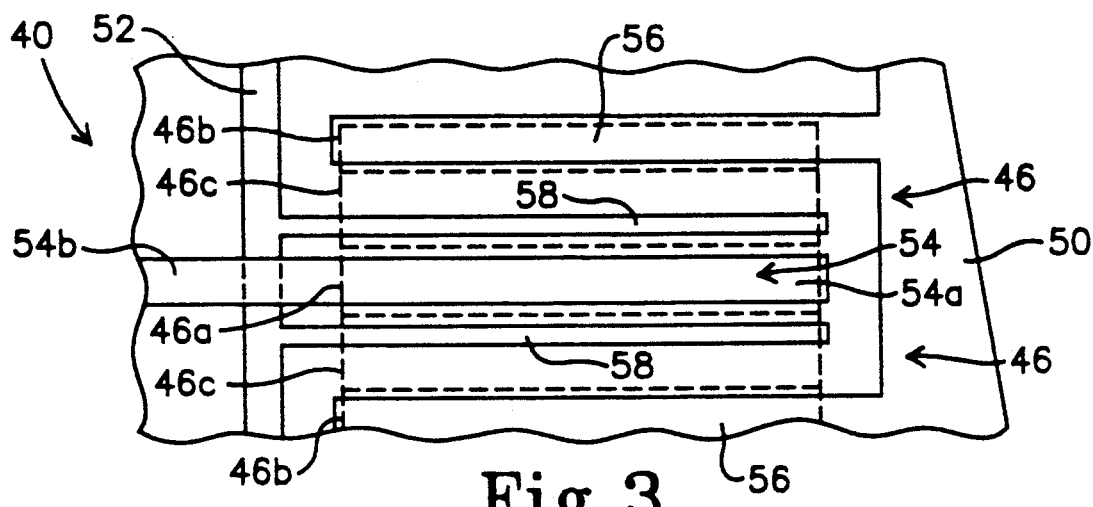
FIG. 3 is a simplified fragmentary plan view to enlarged scale, illustrating the configuration of the present amplifier.
Figure 4:
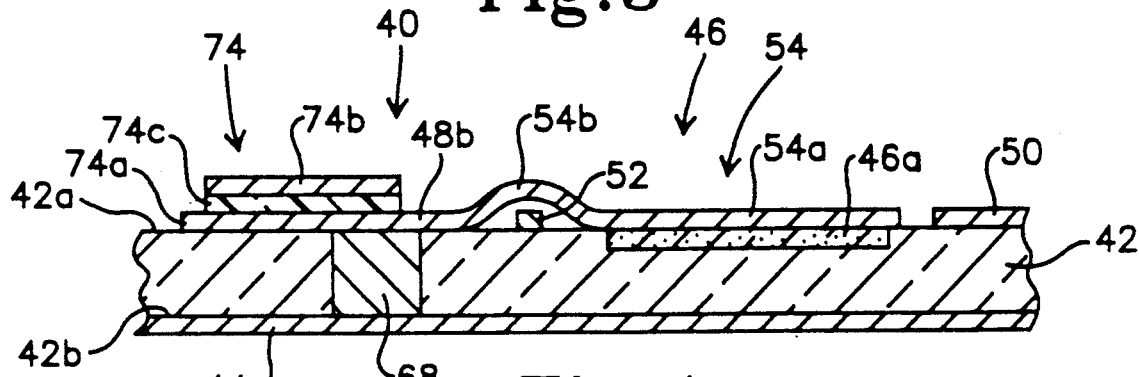
FIG. 4 is a section taken on a line 4–4 of FIG. 2.

In addition to providing a fundamental improvement over the prior art arrangement illustrated in FIG. 1, the present invention further constitutes an advantageous improvement to a topology such as disclosed in a textbook entitled "GaAs MESFET Circuit Design", by R. Soares, Artech House, 1988, pp. 134. As illustrated in FIGS. 2 to 4, a MMIC amplifier embodying the present invention is generally designated as 40 and includes a substrate 42 having a first surface 42a and a second surface 42b which is opposite to the first surface 42a. The substrate 42 is preferably a GaAs wafer, although other insulating or semi-insulating semiconductive materials can be used. An electrically conductive ground plane 44 is formed on the second surface 42b of the substrate 42.

As best viewed in FIG. 3, a plurality of FET unit cells 46 are formed in the first surface 42a of the substrate 42, preferably by ion implantation. Each cell 46 includes a source region 46a, drain region 47b and channel region 46c. The source regions 46a and drain regions 46b are elongated and extend parallel to each other in transverse alternating relation. The channel regions 46c extend between and parallel to the adjacent source regions 46a and 15 drain regions 46b. The cells 46 are preferably n-channel, depletion-mode MESFETs, although the present amplifier arrangement may be embodied with other types of FETs. Where the substrate 12 is GaAs, the preferred dopant for the channel regions 46c is silicon.

The amplifier 40 further includes a source foot 48 consisting of upper and lower sections 48a and 48b. The source foot 48 extends perpendicular to the source regions 46a on a first longitudinally spaced side (the left side as viewed in FIG. 2) of the source, drain and gate regions 46a, 46b and 46c respectively of the cells 46. A drain foot 50 extends perpendicular to the drain regions 46b on a second longitudinally spaced side (the right side as viewed in FIG. 2) of the cells 46. A gate foot 52 extends perpendicular to the gate regions 46c between the source foot 48 and the cells 46.

A plurality of source pads 54 extend from the source foot 48 into electrical connection with the source regions 46a respectively of the cells 46. The source pads 54 each include a first portion 54a which extends substantially over the entire length of the source regions 46a in electrical connection therewith, and a second portion 54b which is formed as an airbridge over the gate foot 52. In this manner, the source pads 54 cross the gate foot 52, but are spaced and electrically isolated therefrom. The source pads 54 may be made considerably narrower than in the prior art amplifier 10 since they are not required to be bonded to an airbridge such as indicated at 34a in FIG. 1.

In a similar manner, drain pads 56 extend from the drain foot 50 into electrical connection with the drain regions 46b, and gate fingers 58 extend from the gate foot 52 into electrical connection with the gate regions 46c of the cells 46 respectively. The drain pads 56 and gate fingers 58 do not require airbridge portions because they do not cross any other electrically conductive elements. The gate fingers 58 are preferably spaced closer to the source pads 54 than to the drain pads 56 to reduce the source resistance.

The drain foot 50 is extended to provide a drain connection pad 60 for collective connection of the drain regions 46b of the cells 46 to external circuitry. A similar gate connection pad 62 is connected to the gate foot 52 by a microstrip line 64. The upper and lower sections 48a and 48b of the source foot 48 are connected to the ground plane 44 by vias 66 and 68 respectively which extend through the substrate 42 between the surfaces 42a and 42b.

In order to enable the amplifier 40 to be used as an accurate module for incorporation into a larger scale MMIC, the present invention improves on the arrangement described above, as disclosed in the textbook to Soares, by providing fixed or preset tuning circuits 70 between the gate foot 52 and each section 48a and 48b of the source foot 48 respectively to adjust the gate capacitance of the amplifier 40 to a predetermined optimal value.

Each tuning circuit 70 includes an inductive stub 72 in the form of a microstrip line, and a capacitor 74 having a lower electrode or plate 74a which is integral with and constitutes an extension of the respective section 48a or 48b of the source foot 48, an upper electrode or plate 74b and a dielectric sheet 74c sandwiched between the plates 74a and 74b.

The inductance of the stubs 72 and the capacitance of the capacitors 74 are selected to provide predetermined values of reactance at the design operating frequency of the amplifier 40. Typical values are 0.3 mH for the stubs 72 and 10 pfd for the capacitors 74 at an operating frequency of 10 GHz.

The amplifier 40 has a common emitter configuration, with the source pads 54 grounded through the source foot 48, vias 66 and 68 and ground plane 44. An input signal is applied to the gate regions of all of the cells 46 in parallel through the gate connection pad 62, microstrip line 64, gate foot 52 and gate fingers 58. An output signal is taken from the drains of all of the cells 46 in parallel through the drain pads 56, drain foot 50 and drain connection pad 60.

The amplifier 40 has low source inductance due to connection of the source pads 54 to ground in parallel, rather than in series as in the prior art amplifier 10 of FIG. 1. The amplifier 40 has a smaller size and more compact layout due to the reduced width of the source pads 54 and relocation of the source feet 54 from the ends to the gate foot side of the amplifier 40. The amplifier 40 can be fabricated at one-third the size of the prior art amplifier 10. The phase variation at the source pads 54 is reduced due to the parallel connection of the pads 54 and reduced spacing between gate fingers 58, resulting in increased signal combining efficiency.

Accurate preset tuning is provided by the tuning circuits 70, enabling the amplifier 40 to be used as a module in larger scale MMIC circuits. Integration of the capacitor 74 with the source foot 48 enables the amplifier 40 to be tuned at the gate foot 52 rather than at a remote location, thereby eliminating undesirable coupling effects and enabling the amplifier 40 to be accurately modeled for design purposes. The present arrangement further eliminates the need for separate vias for the tuning circuits 70, and reduces the area of the amplifier 40 over the prior art topology.

It will be noted that it is physically possible to locate the gate foot 52 between the drain foot 50 and the cells 46, rather than between the source foot 48 and the cells 46. However, this would produce a configuration with unacceptably low phase combining efficiency. Also, it is physically possible to locate the source foot 48 between the gate foot 52 and the cells 46 and provide airbridges between the gate foot 52 and gate fingers 58 rather than between the source foot 48 and source pads 54. However, the gate inductance in such a configuration would be unacceptably high.

EXAMPLE

A MMIC amplifier having the configuration illustrated in FIGS. 2 to 4 was constructed and tested. The gate length was 0.5 micrometers and the gate width was 100 micrometers. The nominal gate spacing was 20 micrometers, with the gate fingers offset toward the source pads by 0.5 micrometers. The total gate periphery was 1.0 mm.

In comparison, the gate length and width for the prior art amplifier 10 were 0.7 and 150 micrometers respectively. The shorter gate length of the amplifier 40 provides a higher current cutoff frequency and thereby higher maximum available gain which are necessary for high efficiency class AB operation. The gate width is narrowed to compensate for the increase in gate resistance produced by the reduction in gate length.

Small gate spacing is necessary to achieve high gate combining efficiency at microwave frequencies. For 90% combining efficiency, the major dimension of the amplifier must be less than one-tenth of the signal wavelength. The gate spacing of 20 micrometers was sufficient to provide satisfactory thermal resistance.

Figure 5:
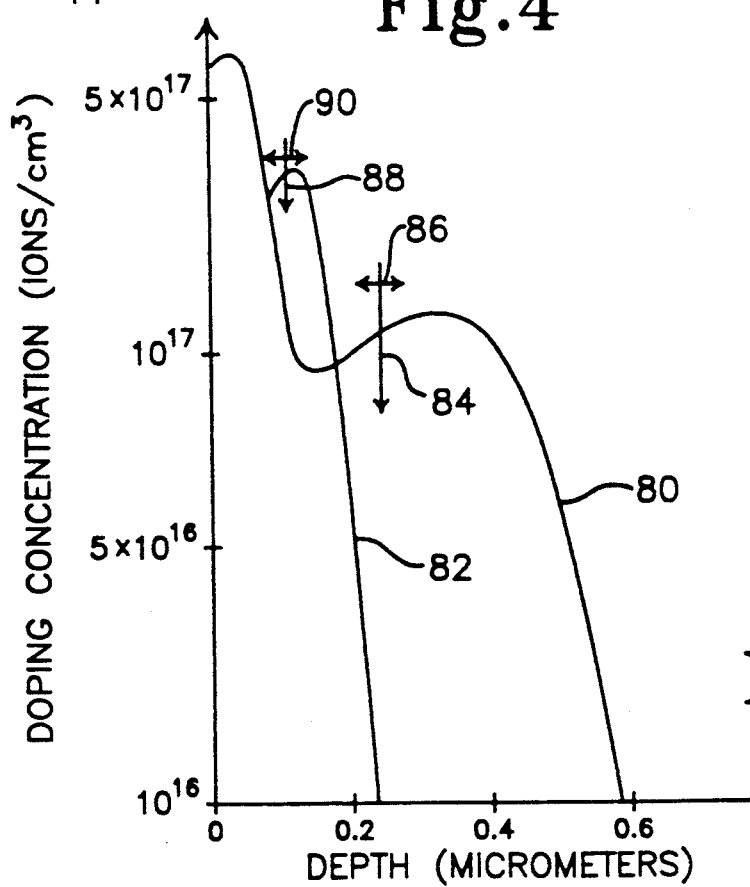
FIG. 5 is a graph illustrating preferred channel doping profiles of the present amplifier for different applications.

As illustrated in FIG. 5, the channel doping profile was selected to optimize the efficiency of the amplifier for either high power as shown by a curve 80, or high gain as shown by a curve 82 at class AB and class B operation. To achieve high power operation, the current density must be at least 280 mA/mm with a thick tunnel layer. The optimal gate recess depth is 0.25 micrometers as indicated by a vertical arrow 84, with the useful range of variation being indicated by a double-headed horizontal arrow 86.

The curve 80 may be produced using ion implantation with silicon dopant species with a first implant at 350 KeV and $6.5 \times 10^{12}$ ions/cm$^3$ followed by a second implant at 50 KeV and $6.0 \times 10^{12}$ ions/cm$^3$. The curve 82 may be produced using a single implant at 300 KeV and $6.5 \times 10^{12}$ ions/cm$^3$. The optimal gate recess depth is 0.11 micrometers as indicated by a vertical arrow 88, with the useful range of variation being indicated by a horizontal double-headed arrow 90.

The performance was tested using a prematched amplifier with input and output impedances transformed to 50 ohms by simple matching networks. The amplifier was mounted in a 50 ohm test fixture and the power performance was measured without tuning at various bias conditions. This enabled the power and efficiency of the amplifier to be determined accurately since the data was obtained from a scalar system without tuning.

The amplifier operated with 48% power-added efficiency and 26.8 dBm of output power at 10 GHz. The bandwidth was approximately 3 GHz, with a maximum drain-source current $I_{DSS}$ of 270 mA/mm, and a pinch-off voltage 3.5 V.

While an illustrative embodiment of the invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

We claim:

1. A distributed field-effect transistor (FET) amplifier, comprising:

a substrate;

a plurality of parallel, elongated source and drain regions formed in the substrate in transverse alternating relation;

a plurality of elongated channel regions formed in the substrate between and parallel to the adjacent source and drain regions respectively;

an elongated source foot extending substantially perpendicular to the source regions on a first longitudinally spaced side of the source, drain and gate regions;

an elongated drain foot extending substantially perpendicular to the drain regions on a second longitudinally spaced side of the source, drain and gate regions which is opposite to said first side;

an elongated gate foot extending substantially perpendicular to the gate regions on said first side between the source foot and the source, drain and gate regions;

a plurality of parallel, elongated source pads extending from the source foot into electrical connection with the source regions respectively, the source pads crossing the gate foot in electrical isolation therefrom;

a plurality of parallel, elongated drain pads extending from the drain foot into electrical connection with the drain regions respectively;

a plurality of parallel, elongated gate fingers extending from the gate foot into electrical connection with the gate regions respectively; and fixed tuning circuit means connected between the gate foot and the source foot, including:
an inductive stub having a first end connected to the gate foot and a second end; and
a capacitor having a first plate which is integral with the source foot and a second plate connected to the second end of the inductive stub.

2. An amplifier as in claim 1, in which the source pads include airbridge regions which extend over the gate foot in spaced relation therefrom.

3. An amplifier as in claim 1, in which:
the substrate has a first surface on which the source foot is formed and a second surface which is opposite to the first surface; and
the amplifier further comprises:
a ground plane formed on the second surface of the substrate; and
a via which extends through the substrate between the first and second surfaces and electrically connects the source foot to the ground plane.

4. An amplifier as in claim 1, in which the gate fingers are spaced closer to the source pads than to the drain pads.

5. A monolithic microwave integrated circuit (MMIC), comprising:
a substrate;
a plurality of parallel, elongated source and drain regions formed in the substrate in transverse alternating relation;
a plurality of elongated channel regions formed in the substrate between and parallel to adjacent source and drain regions respectively;
each adjacent source, drain and gate region constituting a field-effect transistor (FET) amplifier cell;
an elongated source foot extending substantially perpendicular to the source regions on a first longitudinally spaced side of said cells;
an elongated drain foot extending substantially perpendicular to the drain regions on a second longitudinally spaced side of said cells which is opposite to said first side;
an elongated gate foot extending substantially perpendicular to the gate regions on said first side between the source foot and said cells;
a plurality of parallel, elongated source pads extending from the source foot into electrical connection with the source regions respectively, the source pads crossing the gate foot in electrical isolation therefrom;
a plurality of parallel, elongated drain pads extending from the drain foot into electrical connection with the drain regions respectively;
a plurality of parallel, elongated gate fingers extending from the gate foot into electrical connection with the gate regions respectively; and
fixed tuning circuit means connected between the gate foot and the source foot, including:
an inductive stub having a first end connected to the gate foot and a second end; and
a capacitor having a first plate which is integral with the source foot and a second plate connected to the second end of the inductive stub.

6. An integrated circuit as in claim 5, in which the source pads include airbridge regions which extend over the gate foot in spaced relation therefrom.

7. An integrated circuit as in claim 5, in which:
the substrate has a first surface on which the source foot is formed and a second surface which is opposite to the first surface; and
the integrated circuit further comprises:
a ground plane formed on the second surface of the substrate; and
a via which extends through the substrate between the first and second surfaces and electrically connects the source foot to the ground plane.

8. An integrated circuit as in claim 5, in which the gate fingers are spaced closer to the source pads than to the drain pads.

9. An integrated circuit as in claim 5, in which said cells are fabricated in a metal-semiconductor field-effect transistor (MESFET) amplifier configuration.

10. A distributed field-effect transistor (FET) amplifier, comprising:
a substrate;
a plurality of parallel, elongated source and drain regions formed in the substrate in transverse alternating relation;
a plurality of elongated channel regions formed in the substrate between and parallel to the adjacent source and drain regions respectively;
an elongated source foot extending substantially perpendicular to the source regions;
an elongated drain foot extending substantially perpendicular to the drain regions;
an elongated gate foot extending substantially perpendicular to the gate regions;
a plurality of parallel, elongated source pads extending from the source foot into electrical connection with the source regions respectively;
a plurality of parallel, elongated drain pads extending from the drain foot into electrical connection with the drain regions respectively;
a plurality of parallel, elongated gate fingers extending from the gate foot into electrical connection with the gate regions respectively; and
fixed tuning circuit means connected between the gate foot and the source foot, including:
an inductive stub having a first end connected to the gate foot and a second end; and
a capacitor having a first plate which is integral with the source foot and a second plate connected to the second end of the inductive stub.

11. An amplifier as in claim 10, in which the source pads include airbridge regions which extend over the gate foot in spaced relation therefrom.

12. An amplifier as in claim 10, in which:
the substrate has a first surface on which the source foot is formed and a second surface which is opposite to the first surface; and
the amplifier further comprises:
a ground plane formed on the second surface of the substrate; and
a via which extends through the substrate between the first and second surfaces and electrically connects the source foot to the ground plane.

13. An amplifier as in claim 10, in which the gate fingers are spaced closer to the source pads than to the drain pads.

* * * * *